United States Patent [19]
Song

[11] Patent Number: 6,075,257
[45] Date of Patent: Jun. 13, 2000

[54] THIN FILM TRANSISTOR SUBSTRATE FOR A LIQUID CRYSTAL DISPLAY HAVING A SILICIDE PREVENTION INSULATING LAYER IN THE ELECTRODE STRUCTURE

[75] Inventor: Jun-Ho Song, Kyungki-do, Rep. of Korea

[73] Assignee: Samsung Electronics Co., Ltd., Rep. of Korea

[21] Appl. No.: 08/996,824

[22] Filed: Dec. 23, 1997

[30] Foreign Application Priority Data

Dec. 23, 1996 [KR] Rep. of Korea ............. 97-72474
Dec. 27, 1996 [KR] Rep. of Korea ............. 96-73796

[51] Int. Cl.[7] .................................... H01L 29/68
[52] U.S. Cl. .................. 257/59; 257/72; 257/347; 257/348; 257/349; 257/350; 257/351; 257/352; 257/353; 257/354; 349/42; 349/43; 349/147
[58] Field of Search ................ 257/59, 72, 347–354; 349/42, 43, 147

*Primary Examiner*—Fetsum Abraham
*Attorney, Agent, or Firm*—Myers, Bigel, Sibley, & Sajovec

[57] ABSTRACT

A liquid crystal display (LCD) includes silicide-preventing regions between an amorphous silicon layer and source and drain regions. The silicide-preventing regions, which may be thin oxide regions, act as silicide barriers without degrading the contact resistance characteristics. The doped amorphous silicon layer and the amorphous layer may then be uniformly etched by reducing and preferably preventing the formation of silicide when forming the source and drain electrodes.

11 Claims, 6 Drawing Sheets ns257

THIN FILM TRANSISTOR SUBSTRATE FOR A LIQUID CRYSTAL DISPLAY HAVING A SILICIDE PREVENTION INSULATING LAYER IN THE ELECTRODE STRUCTURE

FIELD OF THE INVENTION

This invention relates to microelectronic devices and manufacturing methods, and more particularly to LCDs, thin film transistors and manufacturing methods therefor.

BACKGROUND OF THE INVENTION

Liquid crystal displays (LCDs) are widely used flat panel display devices. As is well known to those having skill in the art, a liquid crystal display generally includes a pair of spaced apart substrates with liquid crystals therebetween. Arrays of spaced apart data lines and gate lines define an array of pixels. A thin film transistor (TFT) for each pixel is electrically connected to a data line, a gate line and a pixel electrode.

LCDs may be classified by the orientation of the liquid crystals between the spaced apart substrates. In a twisted nematic (TN) LCD, the long axes of liquid crystal molecules are aligned parallel to the surfaces of the substrate, and the liquid crystal molecules are twisted between the two substrates. In contrast, in an in-plane switching (IPS) LCD, the liquid crystal molecules are rearranged to be parallel to the substrate upon application of an electric field therebetween.

LCDs may also be classified based on the manufacturing method that is used to form the channel region of the thin film transistors. In an etch stop-type LCD, an insulation layer is formed on a channel region of an amorphous silicon layer. Thus, the etch stop LCD may have a stable current characteristic, but the number of masks that are used may be increased. In contrast, in an etch back-type LCD, the amorphous silicon layer and a doped amorphous silicon layer are successively deposited and etched. Thus, the manufacturing process may be simple, but the amorphous silicon layer may need to be thick to obtain a channel region having a predetermined thickness, since part of the amorphous silicon layer may be removed when etching the doped amorphous silicon layer.

A conventional method of manufacturing an etch back-type thin film transistor LCD will now be described. In general, a plurality of spaced apart gate lines and an array of gate electrodes electrically connected thereto are formed on a substrate. A gate insulating layer is then deposited on the gate electrodes and the gate lines. An undoped amorphous silicon layer and a doped amorphous silicon layer are then deposited and etched to form active thin film transistor patterns. During these steps, organic impurities and an oxide film of nonuniform thickness may be formed on the doped amorphous silicon layer. The organic impurities and the oxide film may be removed by an aqueous hydrogen fluoride etch in a washing process.

A metal film is then deposited and patterned for form an array of spaced apart source and drain electrodes. A silicide layer may be formed to improve the contact characteristics between the doped amorphous silicon layer and the source/drain electrodes.

The doped amorphous silicon layer is then removed using the source/drain electrodes as a mask, to thereby form channel regions for the thin film transistors. During this removal, the amorphous silicon layer and the doped amorphous silicon layer may be nonuniformly etched, since the etch ratio of the silicide is generally different from the etch ratio of the amorphous silicon layer and the doped amorphous silicon layer. The nonuniform etching may degrade image quality of the LCD, since the leakage current may increase when the temperature of the substrate rises if the channel thickness is nonuniform. The degradation in image quality may be particularly severe with large and/or high quality LCDs.

SUMMARY OF THE INVENTION

It is therefore an object of the present invention to provide improved LCDs and TFTs and fabrication methods therefor.

It is another object of the present invention to provide LCD and TFT structures and manufacturing methods that can provide a channel of uniform thickness in the thin film transistors.

These and other objects are provided, according to the present invention, by providing silicide-preventing regions between the amorphous silicon layer and the source and drain electrodes. The silicide-preventing regions, which may be thin oxide regions, act as silicide barriers without degrading the contact resistance characteristics. The doped amorphous silicon layer and the amorphous layer may then be uniformly etched by reducing and preferably preventing the formation of silicide when forming the source and drain electrodes.

In particular, LCDs according to the invention include a substrate, a plurality of spaced apart data lines on the substrate and a plurality of spaced apart gate lines on the substrate that are insulated from and intersect the data lines. An array of thin film transistors is provided on the substrate. Each thin film transistor includes a gate electrode on the substrate that is electrically connected to one of the gate lines, and a gate insulating layer on the gate electrode. The thin film transistors also include an undoped amorphous silicon layer on the gate insulating layer, and a first doped amorphous silicon region on the undoped amorphous silicon layer. A source electrode is provided on the first doped amorphous silicon region and is electrically connected to one of the data lines. A second doped amorphous silicon region is provided on the undoped amorphous silicon layer and spaced apart from the first doped amorphous silicon region. A drain electrode is provided on the second doped amorphous silicon region. An array of pixel electrodes may also be provided on the substrate. A respective drain electrode is electrically connected to a respective pixel electrode.

According to the invention, a first silicide-preventing region is provided between the first doped amorphous silicon region and the source electrode. A second silicide-preventing region is provided between the second doped amorphous silicon region and the drain electrode. Preferably, the first and second silicide-preventing regions comprise first and second oxide regions, and more preferably first and second silicon dioxide regions. First and second silicon dioxide regions are preferably less than about 20 Å thick. Thus, the silicon dioxide regions are sufficiently thick to prevent silicidation of the first and second doped amorphous silicon regions and are also sufficiently thin to provide low contact resistance between the first and second doped amorphous silicon regions and the respective source and drain electrodes.

LCDs are manufactured, according to the present invention, by forming a plurality of spaced apart gate lines and an array of gate electrodes electrically connected thereto on a substrate. A gate insulating layer is formed on the gate electrodes. An undoped amorphous silicon layer is formed on the gate insulating layer, and a doped amorphous silicon layer is formed on the undoped amorphous silicon layer. A silicide-preventing layer is formed on the doped amorphous silicon layer. An array of spaced apart source and drain electrodes comprising silicidable metal is formed on the silicide-preventing layer. The silicide-preventing layer and the doped amorphous layer are then patterned to form an array of spaced apart doped amorphous silicon regions using the spaced apart source and drain electrodes as a mask.

The silicide-preventing layer may be formed by forming an oxide layer on the doped amorphous silicon layer. The oxide layer may be formed by allowing native silicon dioxide to form on the doped amorphous silicon layer. Alternatively, the doped amorphous silicon layer may be oxidized in air. In another alternative, the doped amorphous silicon layer is washed in hydrogen peroxide. The oxide layer is preferably porous, so that low contact resistance may be provided while silicidation is prevented.

Thin film transistors and thin film transistor manufacturing methods as described above may also be used in microelectronic devices other than LCDs. However, when used in LCDs, uniform channel thicknesses may be provided, to thereby allow high quality images to be displayed by the LCD.

DETAILED DESCRIPTION OF PREFERRED EMBODIMENTS

Figure 1:
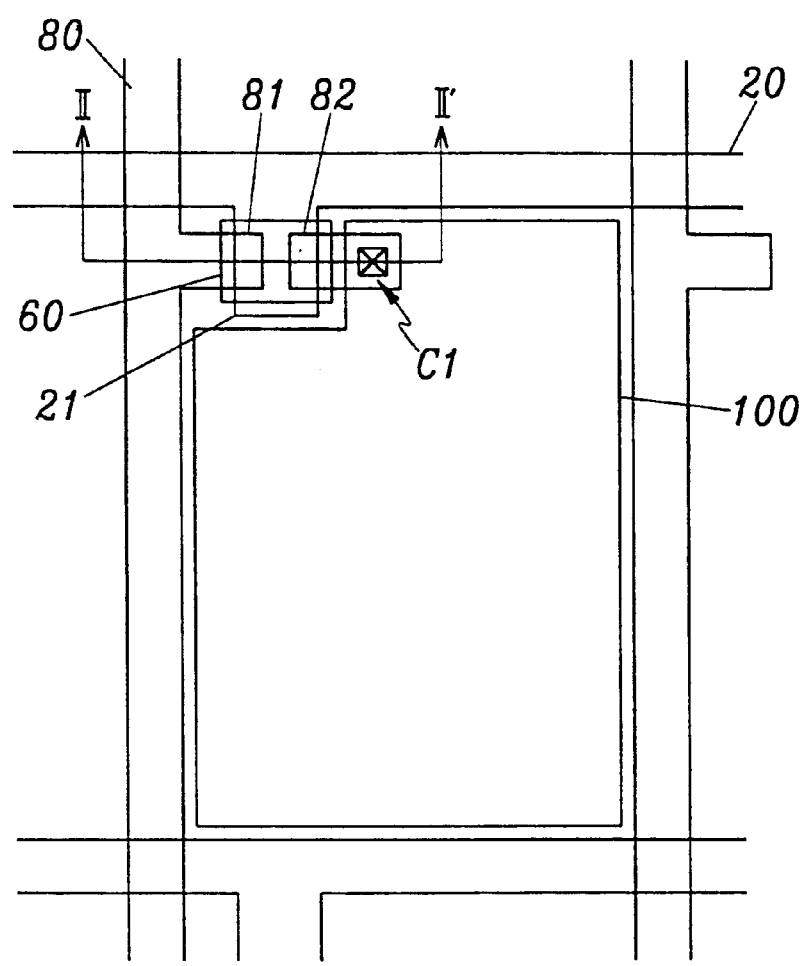
FIG. 1 is a top view of a twisted nematic LCD display according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 2:
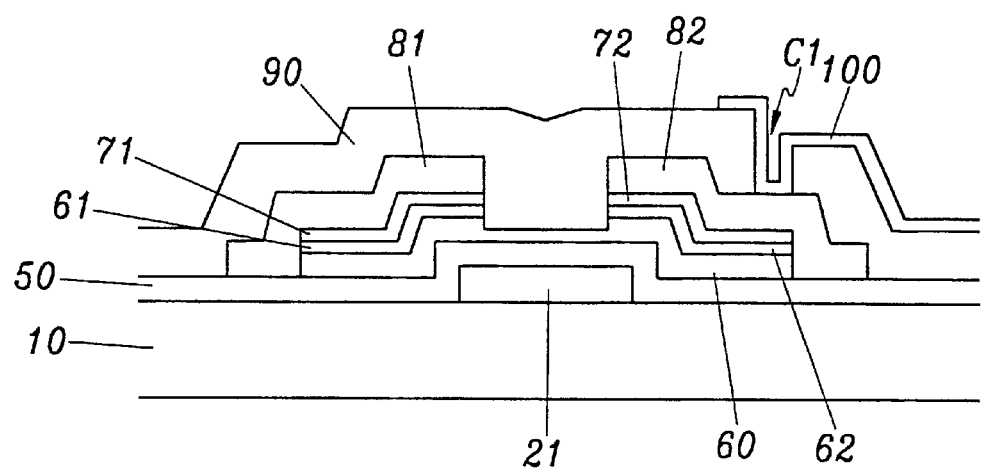
FIG. 2 is a cross-sectional view taken along the line II–II' in FIG. 1.

Referring now to FIG. 1, a layout view of a twisted nematic thin film transistor (TN-TFT) substrate for a liquid crystal display (LCD) according to the invention is shown. FIG. 2 is a cross-sectional view taken along line II–II' of FIG. 1.

As shown in FIGS. 1 and 2, a plurality of spaced apart gate lines are formed on a substrate 10, such as a glass substrate. Portions of the gate lines are elongated to form gate electrodes 21 that are electrically connected to the gate line. A gate insulation film 50 is provided on the gate lines 20 and the gate electrodes 21. A data line 80 and an amorphous silicon layer 60 (also referred to an undoped amorphous silicon layer) are provided on gate insulation film 50. Thus, a plurality of spaced apart data lines 80 on the substrate are insulated from and intersect the gate lines 20. It will be understood that although the data lines in FIG. 1 extend horizontally and the gate lines extend vertically, other arrangements may be used.

Continuing with the descriptions of FIGS. 1 and 2, amorphous silicon layer 60 is provided on the gate electrode 21. A source electrode 81 is provided on the amorphous silicon layer 60. A drain electrode 82 is also provided on amorphous silicon layer 60 and spaced apart from the source electrode. Preferably, the source and drain electrodes are centered about the gate electrode 21.

Still referring to FIGS. 1 and 2, first and second doped amorphous silicon regions 61 and 62 are provided between the amorphous silicon layer and the source electrode 81 and the drain electrode 82, respectively. The doped amorphous silicon regions 61 and 62 can improve the electrical contact characteristics. First and second silicide preventing regions 71 and 72 are provided between the first doped amorphous silicon region 61 and the source electrode 81, and between the second doped amorphous silicon region 62 and the drain electrode 82, respectively. Preferably, the first and second silicide-preventing regions are first and second oxide layers having thickness of less than about 20 Å. The oxide layers may be native oxide films that form on the doped amorphous silicon regions.

Figure 3A:
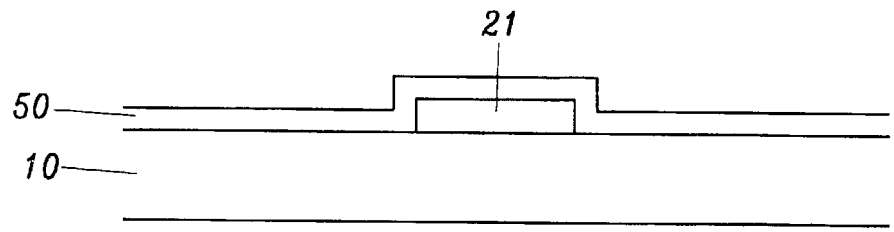
FIGS. 3a–3e are cross-sectional views of LCDs of FIG. 1 during intermediate manufacturing steps.

Referring now to FIGS. 3a–3e, methods of manufacturing LCDs including TFTs according to the present invention, will now be described. As shown in FIG. 3a, a first metal layer is deposited on an LCD substrate 10 and patterned to form a plurality of spaced apart gate lines 20 and an array of gate electrodes 21. A gate insulation layer 50 is then formed.

Figure 3B:
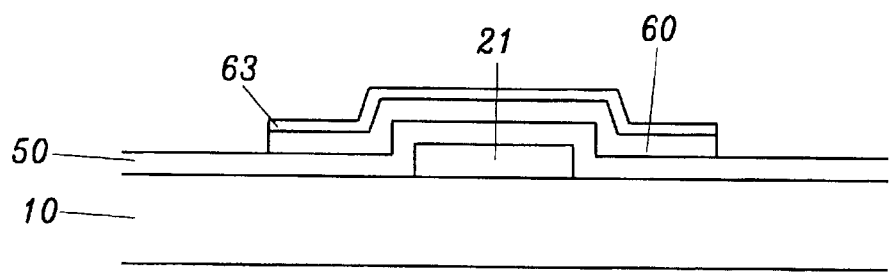

Referring to FIG. 3b, an amorphous silicon layer 60 and a doped amorphous silicon layer 63 are then successively deposited and patterned to form an active pattern. Wet washing may be performed to remove an oxidation film of nonuniform thickness that is formed on the substrate.

Figure 3C:
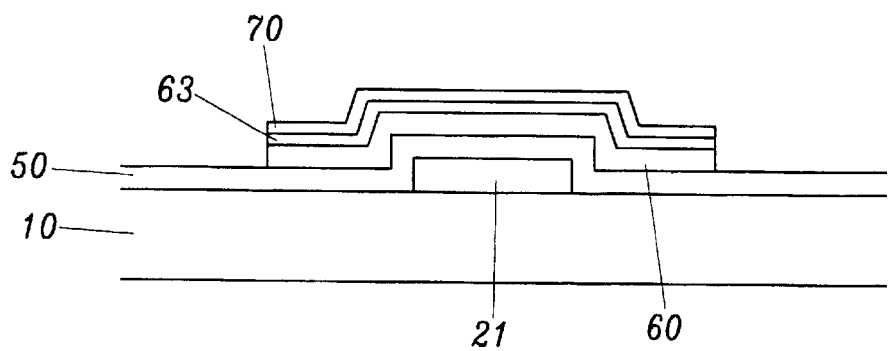

Referring now to FIG. 3c, a silicide-preventing layer 70 is formed on the doped amorphous silicon layer 63. The silicide-preventing layer 70 is preferably an oxide film that is sufficiently thick to prevent silicidation of the doped amorphous silicon layer 63, but is sufficiently thin to provide low contact resistance to source and drain electrodes that are formed subsequently. The silicide preventing layer 70 may be formed by washing the doped amorphous silicon layer 63 in diluted aqueous hydrogen peroxide solution, by allowing a native silicon dioxide to form in air, or using other techniques for forming thin oxide films. When diluted aqueous hydrogen peroxide is formed, the thin oxidation film 70 is formed by the following chemical reaction:

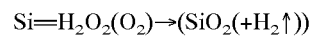

It will be understood that the tunneling effect may be degraded by the presence of the oxide film which can increase the contact resistance between the doped amorphous silicon region 63 and the source and drain electrodes. This can reduce the on current of the thin film transistor by 3% or more if the silicide-preventing layer 70 is too thick. Accordingly, the silicide-preventing layer 70 is preferably less than about 20 Å thick, which is thin enough to reduce and preferably minimize the contact resistance. The silicide-preventing layer 70 is also preferably formed to have porosity, to allow low contact resistance while still preventing silicide formation.

Figure 3D:
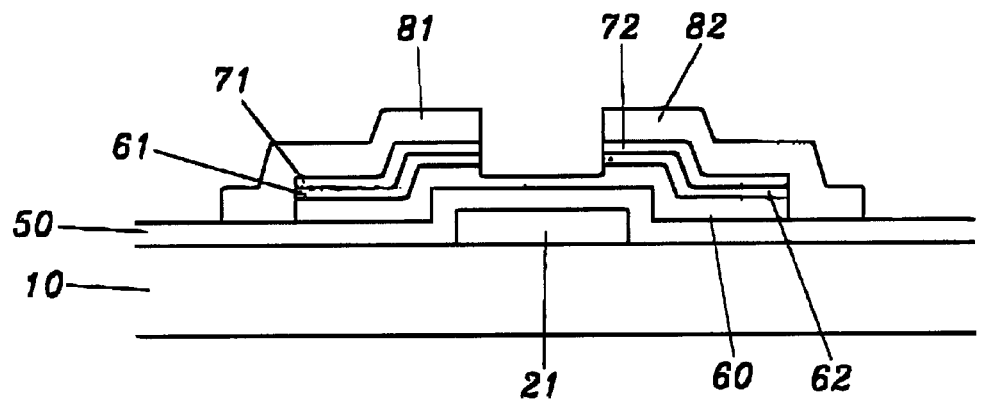

Referring now to FIG. 3d, a second metal film is deposited and patterned form a plurality of spaced apart data lines 80, and an array of source electrodes 81 and drain electrodes 82 that are spaced apart from the source electrodes 81. The data lines 80 and source and drain electrodes 81 and 82 may be formed using a metal such as molybdenum or chromium or other silicidable metals that form a silicide by reaction with silicon.

Still referring to FIG. 3d, the silicide-preventing layer 70 and the doped amorphous silicon layer 63 are then etched using the source and drain electrodes 81 and 82 as a mask, to form first and second oxide regions 71 and 72, and first and second doped amorphous silicon regions 61 and 62.

During etching, some of the amorphous silicon layer 60 under the doped amorphous silicon regions 61 and 62 may be etched, as shown in FIG. 3d. However, the doped amorphous silicon regions 61 and the 62, and the amorphous silicon layer 60 are preferably uniformly etched, since the silicide-preventing films 71 and 72 have a uniform etching property. Accordingly, preferably, the amorphous silicon regions 61 and 62 and the amorphous silicon layer 60 are uniformly etched to the same thickness as that of the surface of the channel region of each TFT in the substrate 10.

Figure 3E:
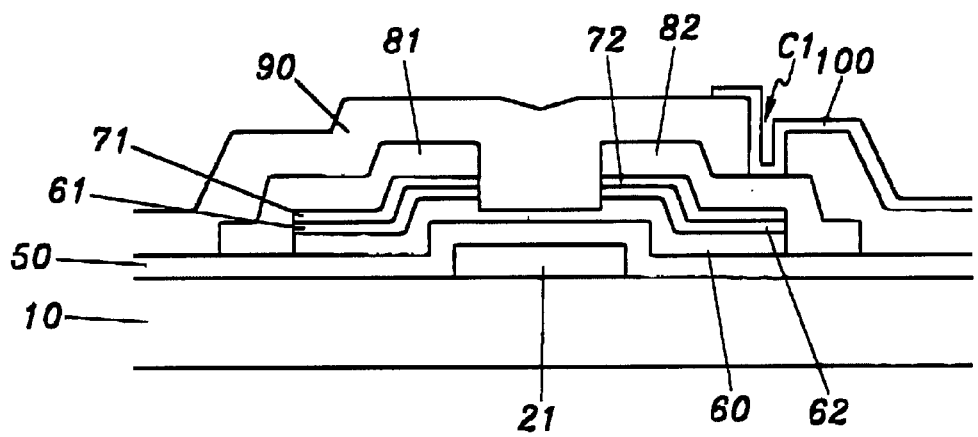

Finally, as shown in FIGS. 1 and 3e, a passivation film 90 is deposited, a contact hole C1 is formed, and a pixel electrode 100 is formed. Accordingly, uniform thickness of the channel region in the undoped amorphous silicon layer 60 between the doped amorphous silicon layers 61 and 62 may be obtained because silicide is not present.

Figure 4:
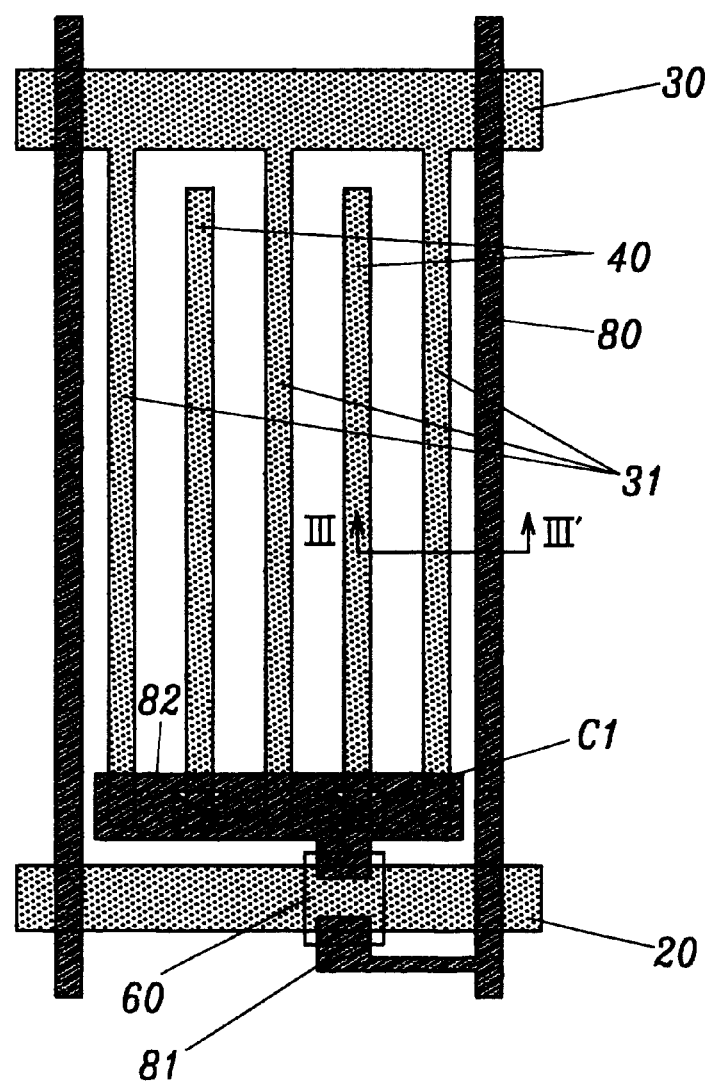
FIG. 4 is a top view of an in-plane switching LCD according to the present invention.
Figure 5:
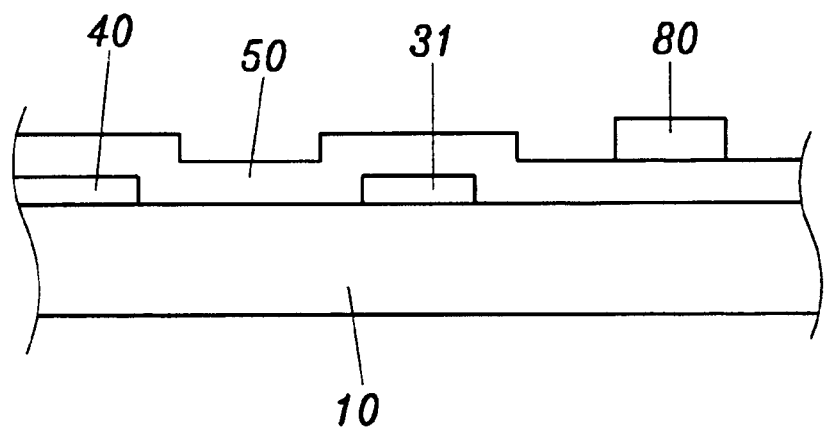
FIG. 5 is a cross-sectional view taken along the line III–III' of FIG. 4.

FIG. 4 is a layout view of an IPS LCD according to the invention, and FIG. 5 is a cross-sectional view taken along the line III–III' of FIG. 4. In IPS LCDs according to the invention, the gate electrodes, the data electrodes and the TFT structures can be the same as in TN LCD, as described above. They may also be different. The pixel electrode and a common electrode may be different from the TN LCD, as will now be described.

As shown in FIG. 4, a common electrode line 30 is formed parallel to the gate line 20 on the substrate 10. A plurality of common electrodes 31 extend from the common electrode line 30 in parallel, spaced apart relation. A plurality of pixel electrodes 40 are formed parallel to and between the common electrodes 31. The pixel electrodes 40 and the common electrodes 31 may be formed of the same material in the same layer, and may extend parallel to the data lines 80 that are formed on the gate insulation film 50. As also shown, one portion of the pixel electrodes 40 is connected to the drain electrode 82 through the contact hole C1 formed in insulation film 50.

The thin film transistor is manufactured similar to that described in FIGS. 2 and 3a–3e. However, the common electrode line 30, the common electrodes 31 and the pixel electrodes 40 may be formed at the same time that the gate electrode 21 and the gate line 20 are formed, as shown in FIG. 5.

Accordingly, silicide formation may be reduced and preferably prevented by forming a native oxide film of uniform thickness before depositing metal for the source and drain electrodes. Thus, silicide formation may be reduced or prevented and channel regions having uniform on and off current characteristics over the entire LCD substrate may be formed. Thus, it is preferable that the formation of silicide is reduced or prevented over the entire substrate. Accordingly, large LCDs having uniform display characteristics can be obtained using simple manufacturing processes.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A thin film transistor comprising:

a substrate;

a gate electrode on the substrate;

a gate insulating layer on the gate electrode;

an undoped amorphous silicon layer on the gate insulating layer;

a first doped amorphous silicon region on the undoped amorphous silicon layer;

a source electrode on the first doped amorphous silicon region;

a second doped amorphous silicon region on the undoped amorphous silicon layer and spaced apart from the first doped amorphous silicon region;

a drain electrode on the second doped amorphous silicon region;

a first silicide-preventing region between the first doped amorphous silicon region and the source electrode; and a second silicide-preventing region between the second doped amorphous silicon region and the drain electrode.

2. A thin film transistor according to claim 1 wherein the first and second silicide-preventing regions comprise first and second oxide regions.

3. A thin film transistor according to claim 2 wherein the first and second oxide regions are first and second silicon dioxide regions.

4. A thin film transistor according to claim 3 wherein the first and second silicon dioxide regions are less than about 20 Å thick.

5. A thin film transistor according to claim 1 wherein the first and second silicide-preventing regions are sufficiently thick to prevent silicidation of the first and second doped amorphous silicon regions and are sufficiently thin to provide low contact resistance between the first and second doped amorphous silicon regions and the respective source and drain electrodes.

6. A liquid crystal display (LCD) comprising:

a substrate;

a plurality of spaced apart data lines on the substrate;

a plurality of spaced apart gate lines on the substrate that are insulated from and intersect the data lines; and an array of thin film transistors on the substrate, each thin film transistor comprising:

a gate electrode on the substrate that is electrically connected to one of the gate lines;

a gate insulating layer on the gate electrode;

an undoped amorphous silicon layer on the gate insulating layer;

a first doped amorphous silicon region on the undoped amorphous silicon layer;

a source electrode on the first doped amorphous silicon region that is electrically connected to one of the data lines;

a second doped amorphous silicon region on the undoped amorphous silicon layer and spaced apart from the first doped amorphous silicon region;

a drain electrode on the second doped amorphous silicon region;

a first silicide-preventing region between the first doped amorphous silicon region and the source electrode; and a second silicide-preventing region between the second doped amorphous silicon region and the drain electrode.

7. An LCD according to claim 6 wherein the first and second silicide-preventing regions comprise first and second oxide regions.

8. An LCD according to claim 7 wherein the first and second oxide regions are first and second silicon dioxide regions.

9. An LCD according to claim 8 wherein the first and second silicon dioxide regions are less than about 20 Å thick.

10. An LCD according to claim 6 wherein the first and second silicide-preventing regions are sufficiently thick to prevent silicidation of the first and second doped amorphous silicon regions and are sufficiently thin to provide low contact resistance between the first and second doped amorphous silicon regions and the respective source and drain electrodes.

11. An LCD according to claim 6 further comprising:

an array of pixel electrodes on the substrate, a respective drain electrode being electrically connected to a respective pixel electrode.

* * * * *

UNITED STATES PATENT AND TRADEMARK OFFICE
CERTIFICATE OF CORRECTION

PATENT NO.  : 6,075,257
DATED       : June 13, 2000
INVENTOR(S) : Jun-Ho Song

Page 1 of 1

It is certified that error appears in the above-identified patent and that said Letters Patent is hereby corrected as shown below:

[30] Please delete the priority date of Korean Application No. 97-72474 of "Dec. 23, 1996" and substitute - December 23, 1997 - therefor.

[56] Please add the following references:
Streetman, Ben G., "Solid State Electronic Devices," 4th Ed., Prentice-Hall, Inc., New Jersey, 1995, pp. 41-42

Wolf, S., "Silicon Processing for the VLSI Era, Vol. 2, Lattice Press, California, 1990, p. 434

Signed and Sealed this

Fourteenth Day of August, 2001

*Attest:*

*Attesting Officer*

NICHOLAS P. GODICI
*Acting Director of the United States Patent and Trademark Office*